United States Patent [19]

Guo et al.

[11] Patent Number: 5,774,002
[45] Date of Patent: Jun. 30, 1998

[54] FREQUENCY DOUBLER FOR AN OPTICAL TRANSCEIVER CLOCK RECOVERY CIRCUIT

[75] Inventors: Song-Yuen Guo, Taichung; Jin-San Ko, Tapei, both of Taiwan

[73] Assignee: Industrial Technology Research Institiute, Hsinchu, Taiwan

[21] Appl. No.: 843,900

[22] Filed: Apr. 25, 1997

Related U.S. Application Data

[63] Continuation of Ser. No. 603,357, Feb. 20, 1996, abandoned, which is a continuation of Ser. No. 400,280, Mar. 3, 1995, abandoned, which is a continuation of Ser. No. 949,169, Sep. 22, 1992, abandoned.

[51] Int. Cl.$^6$ .............................. H04L 25/20; H04L 7/027
[52] U.S. Cl. .......................... 327/165; 327/113; 327/116; 327/356
[58] Field of Search ...................... 528/20, 164; 307/271, 307/529, 268, 522; 327/165, 166, 105, 113, 116, 119, 122, 355, 356; 375/354; 326/52, 54, 126

[56] References Cited

U.S. PATENT DOCUMENTS

| | | | |
|---|---|---|---|
| 3,226,570 | 12/1965 | Rosenbaum | 307/606 |
| 4,041,326 | 8/1977 | Robinson | 307/471 |
| 4,715,049 | 12/1987 | Andrews et al. | 375/106 |
| 4,775,805 | 10/1988 | Whitefoot | 307/471 |
| 4,814,874 | 3/1989 | Adachi | 358/140 |
| 4,843,331 | 6/1989 | Yang | 328/20 |
| 5,197,082 | 3/1993 | Uda et al. | 328/164 |
| 5,235,233 | 8/1993 | Yamamoto | 310/313 |

FOREIGN PATENT DOCUMENTS

| | | | |
|---|---|---|---|
| 56-71350 | 6/1979 | Japan . | |
| 59-193050 | 4/1986 | Japan | 326/52 |
| 61-245626 | 10/1986 | Japan | 326/52 |
| 4-200037 | 7/1992 | Japan . | |

OTHER PUBLICATIONS

Breslau, "Frequency Doubler", IBM Technical Bulletin, vol. 10, No. 6, Nov. 1967, p. 723.

Vijayakumaran Nair et al., "Square Wave Division for Symmetrical Outputs", Electronic Engineering, vol. 49, No. 592, (May 1977), p. 26.

*Primary Examiner*—Timothy P. Callahan
*Assistant Examiner*—T. T. Lam
*Attorney, Agent, or Firm*—Meltzer, Lippe, Goldstein, et al.

[57] ABSTRACT

A clock recovery circuit is disclosed for recovering the data of a non-return to zero signal received at an optical transceiver. The clock recovery circuit includes an active element mixer for doubling the frequency of the received non-return to zero encoded digital signal. The mixer includes a delay element for delaying the received non-return to zero signal and an exclusive-OR circuit for exclusive-ORing the delayed and received non-return to zero signals. A SAW filter is also provided for recovering a clock from the frequency doubled signal outputted by the mixer.

1 Claim, 6 Drawing Sheets

FREQUENCY DOUBLER FOR AN OPTICAL TRANSCEIVER CLOCK RECOVERY CIRCUIT

This is a continuation of application Ser. No. 08/603,357, filed Feb. 20, 1996, now abandoned, which is continuation of application Ser. No. 08/400,280 filed on Mar. 3, 1995, now abandoned, which is a continuation of application Ser. No. 07/949,169 filed on Sep. 22, 1992, now abandoned.

FIELD OF THE INVENTION

The present invention relates to recovering a remote clock from a digital signal transmitted by optical radiation. In particular, the invention relates to a mixer with active, rather than passive, circuit elements which doubles the frequency of a received non-return to zero digital signal. The output signal of the mixer, therefore, need not be amplified prior to filtering the clock therefrom.

BACKGROUND OF THE INVENTION

An optical communication system 10 is depicted in FIG. 1. As depicted, the system 10 has two optical transceivers 12 and 14. Each optical transceiver, e.g., the optical transceiver 12, is capable of simultaneously transmitting optical signals to, and receiving optical signals from, the other optical transceiver, e.g., the optical transceiver 14. Illustratively, optical signals transmitted by the optical transceivers 12 and 14 are coupled into one or more optical fibers 16. The optical signals propagate on the optical fibers 16 from one optical transceiver to the other where they are received.

Optical signals may illustratively be transmitted pursuant to the Synchronous Optical Network (SONET) signal hierarchy. SONET refers to a hierarchical family of digital signals whose bit rates are integer multiples of a basic module signal. The basic module signal comprises a sequence of repeating frames. Each frame comprises a bit stream of digital bits.

The basic module or first level of the SONET signal hierarchy is called the Synchronous Transport Signal-Level 1 (STS-1). An STS-1 signal has a bit rate of 51.84 million bits per second (Mb/sec). Higher rate SONET signals are obtained by byte interleaving N frame aligned STS-1 signals to form an STS-N signal in accordance with conventional SONET technology. For example, three STS-1 signals may be multiplexed by a multiplexer into an STS-3 signal. The bit rate of the STS signal is three times the bit rate of an STS-1 signal or 3×51.84 Mb/sec=155.52 Mb/sec. When transmitted using optical fibers, the STS-N signal is converted to optical form and is designated as the OC-N signal.

Referring now to FIG. 2, the receiver portion 20 of a conventional optical transceiver, e.g., the optical transceiver 12, is depicted. Illustratively, such an optical transceiver 12 is part of an OC-3 optical communication system 10 (see FIG. 1). Received optical signals impinge on a photodetector 22. Illustratively, the photodetector is a pin-FET photodiode. The photodetector 22 converts the received optical signals into electrical signals. Illustratively, the photodetector 22 additionally amplifies the electrical signals.

An electrical signal outputted by the photodetector 22 is inputted to a limiting amplifier 24. The limiting amplifier 24 amplifies the signal outputted by the photodetector 22 to an acceptable level for further processing. For example, the amplifier 24 outputs a signal with a 0.6 volt peak to peak amplitude. The signal outputted by the photodetector 22 may also be inputted to a low-light indicator circuit 26. Illustratively, the low-light indicator circuit 26 monitors the intensity of the received light. In such a case, the low-light indicator circuit 26 displays a warning (e.g., via an LED display) if the received optical energy falls below a certain threshold (e.g., −38 dBm).

The signal outputted by the limiting amplifier 24 is illustratively fed to a low-signal indicator circuit 28. The low-signal indicator circuit 28 monitors the signal output from the amplifier 24 and outputs a warning (e.g., via an LED display) if no signal is present. The signal outputted from the limiting amplifier 24 is also fed to a decision circuit 30. The decision circuit 30 recovers the data from the received signal. Illustratively, the received signal is a bit stream encoded as a non-return to zero (NRZ) signal. Such a signal is depicted in FIG. 3. A NRZ signal is divided into periods of uniform length. Each period encodes one bit of a sequence of bits. Illustratively, each bit is represented as a high signal level during this entire period if the bit is logic '1' and by a low signal level if the bit is logic '1'.

As depicted in FIG. 3, the bit sequence '10110110' is encoded as a NRZ signal. Repeated bits in a sequence, e.g., '11', are encoded as a uniform signal level lasting for the duration of both corresponding periods. Such an encoding scheme is desirable to transmit as much data within a given bandwidth of a communication system.

If the period of each bit is known, and the transition between bits with different logic values (e.g., a logic '1' followed by a logic '0' or a logic '0' followed by a logic '1') may be determined from the received signal itself, then the transmitted sequence of bits may be easily recovered from the NRZ signal. However, the transmission of an optical signal within the optical communication system 10 (FIG. 1) distorts the NRZ signal. As such, the received signal generally no longer retains its original shape. For example, FIG. 4 depicts the wave form of a received signal corresponding to the originally transmitted sequence of bits '110'. Thus, in order to decode a distorted NRZ signal, a clock, having a pulse which coincides with each transition from one logic value to a different logic value, must first be recovered from the NRZ signal. With a NRZ signal, the amplitude of the frequency at the clock rate is, in theory, zero. Therefore, in order to recover the clock from the NRZ signal, its frequency must first be doubled.

Referring again to FIG. 2, the decision circuit 30 is connected to several stages which assist in recovering the aforementioned clock. The decision circuit 30 outputs the received NRZ signal to a conventional mixer 32. The mixer 32 doubles the frequency of the received NRZ signal. A conventional mixer 32 uses only passive elements. Hence, the frequency doubled NRZ signal outputted from the mixer 32 is attenuated. An amplifier 34, which amplifies the frequency doubled signal, is therefore connected to the output of the mixer 32.

The amplified frequency doubled signal is then fed to a SAW (surface acoustic wave) filter 36. The SAW filter 36 is used to recover the clock from the amplified frequency doubled signal. Such filters are well known in the art. However, the insertion loss of the SAW filter 36 may be as high as 17 dBm. The recovered clock is therefore fed to a clock amplifier 38 which amplifies the recovered clock.

The amplified clock is then fed to a phase adjuster 40. The phase adjuster 40 adjusts the phase of the amplified, recovered clock to optimize the recovery of bits from the received NRZ signal. Finally, the recovered clock is fed from the phase adjuster 40 to the decision circuit 30. Using the clock to determine the boundaries of each transition in the received signal, the decision circuit 30 recovers the transmitted bit sequence. This sequence is outputted on the output line D (and the complement of the sequence is outputted on the line $\overline{D}$). Additionally, the clock may be fed to a level shifter 42 which adjusts the levels of the clock signal. The clock signal levels are adjusted to properly drive other logic circuits which may receive the clock signal. The level adjusted clock signal is then outputted on the line C (and the complement of the clock signal is outputted on the line $\overline{C}$).

The conventional clock recovery configuration 32–40 is disadvantageous because the mixer 32 inserts a relatively high loss into the signal. This necessitates that an amplifier 34 be inserted between the mixer 32 and the SAW filter 36. It is therefore an object of the present invention to provide a clock recovery circuit which dispenses with the need for an amplifier between the mixer and SAW filter.

SUMMARY OF THE INVENTION

The present invention achieves this and other objects by providing a mixer which uses active elements, rather than passive elements. The inventive mixer includes a delay element which delays the received non-return to zero (NRZ) signal by a predetermined period. Illustratively, this period equals one fourth of the period of a NRZ signal which encodes a sequence of alternating logic value bits, i.e., '101010 . . . . ' This delayed signal and the (non-delayed) received NRZ signal are then XORed (exclusive-ORed) to generate a frequency doubled signal. This frequency doubled signal is then fed to a SAW filter which recovers the clock.

The XOR circuit may illustratively be implemented using emitter coupled logic. In such a case, the XOR circuit may include a transistor array formed into a Gilbert cell.

Illustratively, the XOR circuit comprises an OR gate, a NOR gate and a multiplexer. The OR gate is connected so that the delayed NRZ signal is ORed with the logic value '0'. The NOR gate is similarly connected so that the delayed NRZ signal is NORed with the logic value '0'. The (non-delayed) received NRZ signal is fed to the multiplexer which enables the OR gate if the received NRZ signal is a logic '0' and enables the NOR gate if the received NRZ signal is a logic '1'. The received NRZ signal thus causes the output of a signal corresponding to the delayed signal if the received NRZ signal is a logic '0' or a signal corresponding to the complement of the delayed signal if the received NRZ signal is a logic '1'.

The delay element of the input signal illustratively comprises an inductor. Such an inductor may illustratively be formed from an electrical conductor of the appropriate length to produce the correct delay.

DESCRIPTION OF THE INVENTION

Figure 1:
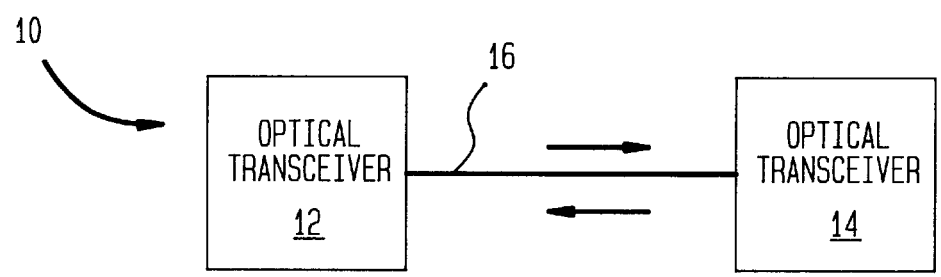
FIG. 1 depicts an optical communication system comprising a pair of remotely located optical transceivers.
Figure 2:
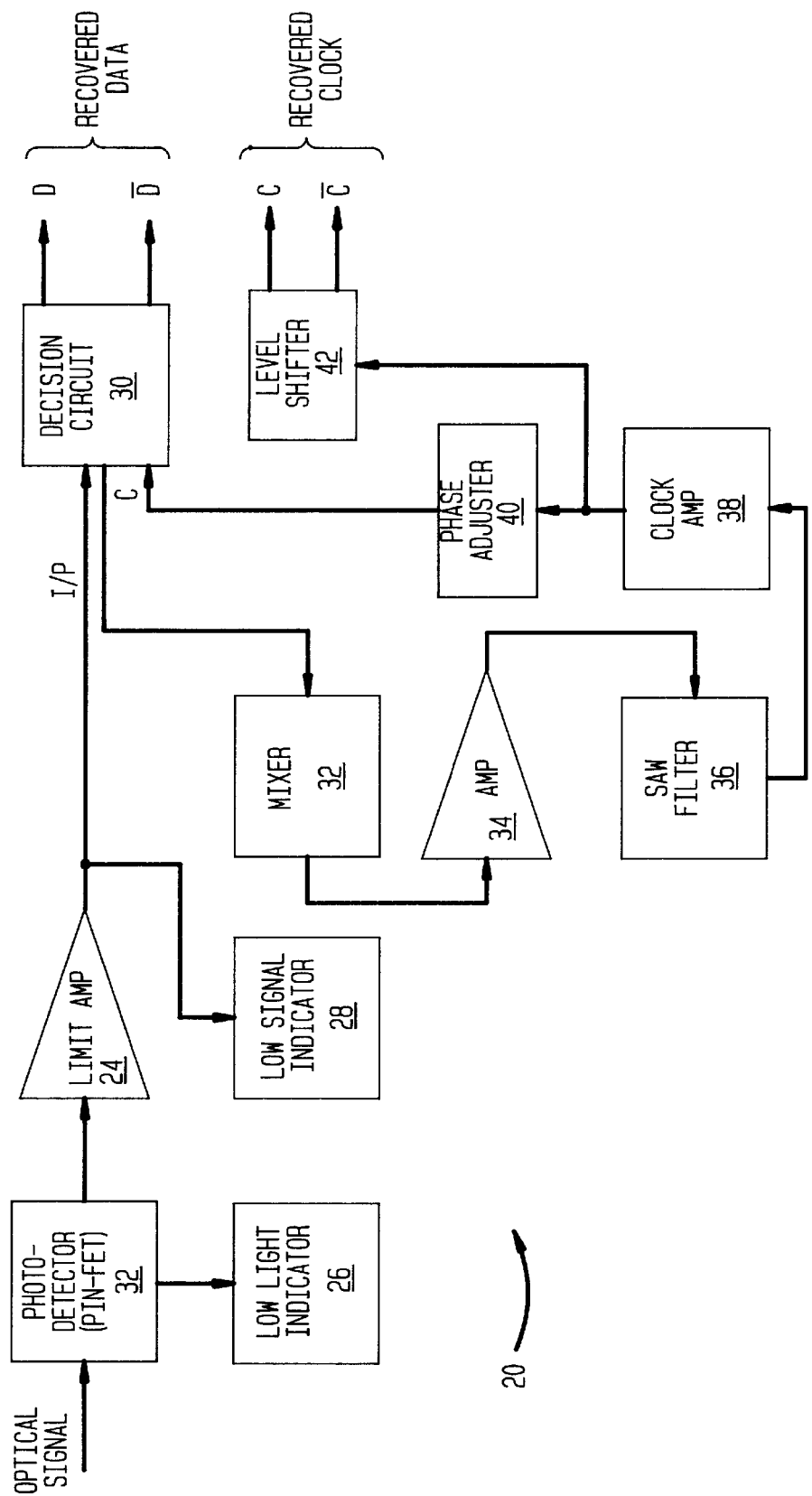
FIG. 2 depicts the receiver portion of a conventional optical transceiver.
Figure 3:
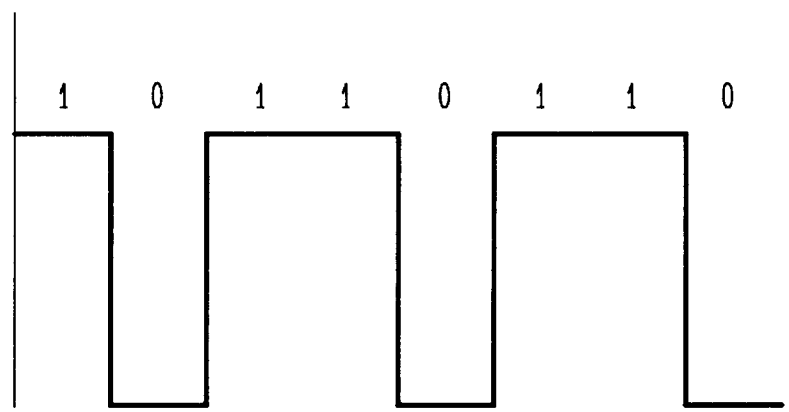
FIG. 3 illustrates a non-return to zero (NRZ) encoded digital signal.
Figure 4:
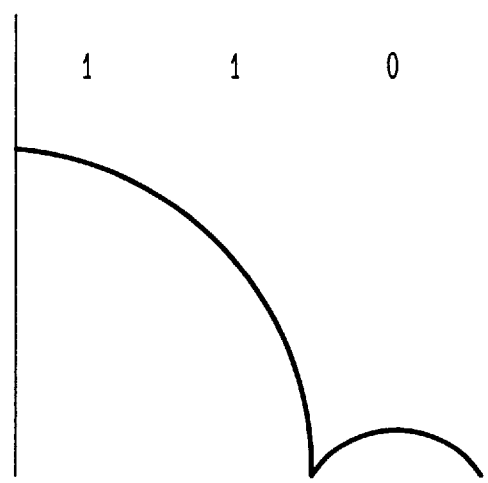
FIG. 4 illustrates a distorted non-return to zero (NRZ) encoded digital signal.
Figure 5:
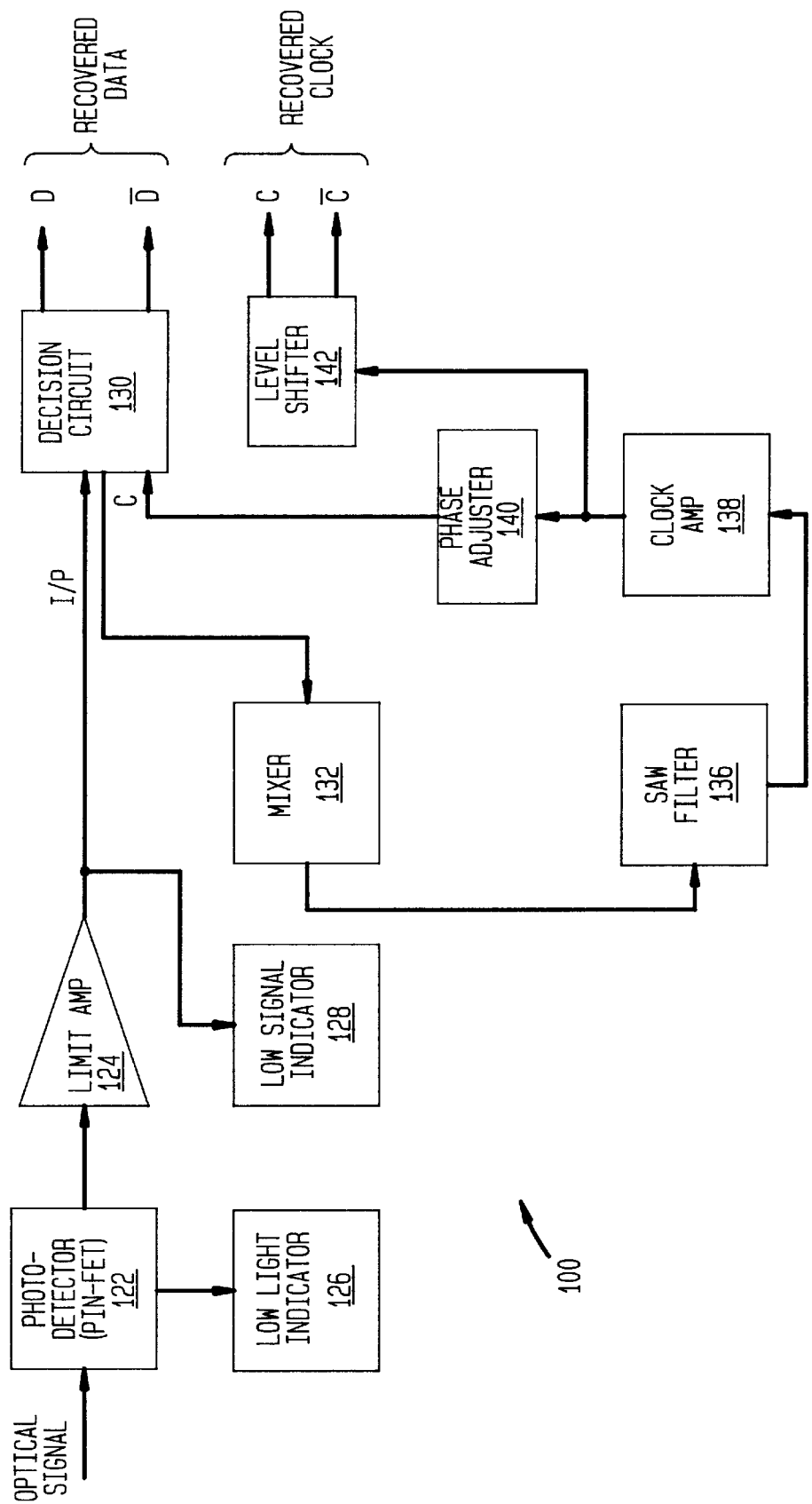
FIG. 5 depicts the receiver portion of an optical transceiver according to an embodiment of the present invention.

Referring now to FIG. 5, the receiver portion 100 of an optical transceiver according to the present invention is depicted. As in the receiver 20 of FIG. 2, the receiver 100 has a photodetector 122, limiting amplifier 124, low-light indicator circuit 126, low-signal indicator circuit 128, and decision circuit 130. Each of these elements is connected in the same fashion as before and performs the same function as the corresponding elements of the receiver 20 of FIG. 2.

Figure 6:
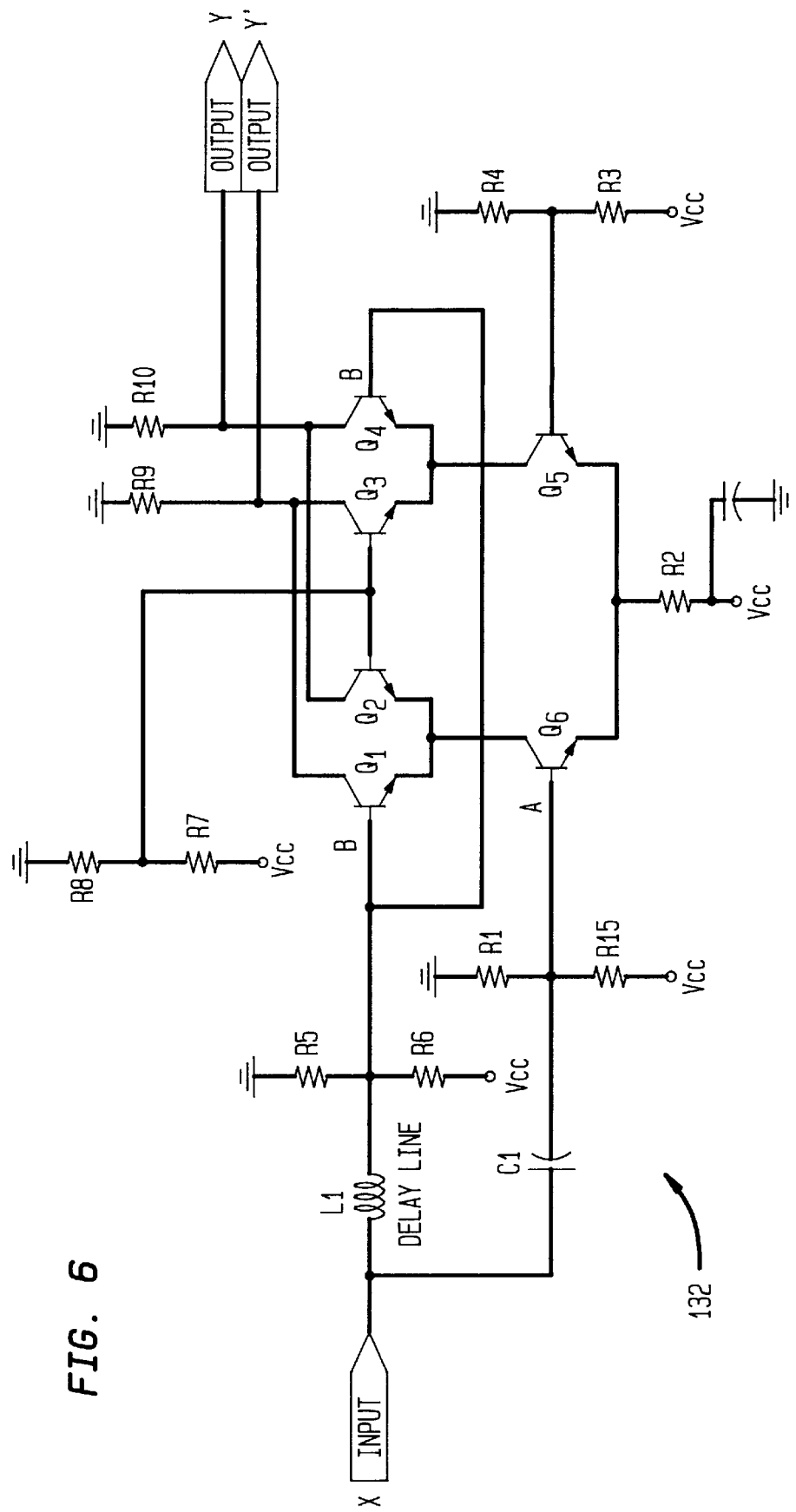
FIG. 6 depicts an embodiment of a mixer used in the receiver portion depicted in FIG. 5.

The receiver 100 also comprises a mixer 132 according to the present invention which uses active elements to double the frequency of the received NRZ signal. By using active elements, losses may be minimized or eliminated from the frequency doubling process. FIG. 6 depicts an illustrative circuit 132 for doubling the frequency of a received NRZ signal without inserting loss into the circuit 100.

The mixer 132 shown in FIG. 6 is an emitter coupled logic circuit comprising a transistor array connected in the form of a Gilbert cell. To understand the operation of such a circuit 132 it is advantageous to consider the function of various parts of the circuit 132 separately. The mixer 132 has three pairs of transistors, Q1–Q2, Q3–Q4 and Q5–Q6. The transistors of each pair, for example, the pair Q5–Q6, have their respective emitters connected together. By means of these interconnections, any current supplied to the common emitter connection of a pair will be supplied almost entirely to the transistor of the pair having the greater base voltage. For example, the pair of transistors Q5–Q6 have their emitters connected to the voltage supply $V_{cc}$ via the resistor R2. Thus, a steady current is supplied to the emitters of each transistor Q5–Q6. A particular reference voltage, as determined by the source $Q_{cc}$ and the resistors R3 and R4, is supplied to the base of the transistor Q5. Similarly, a particular voltage, as determined by the source $V_{cc}$ and the resistors R15 and R1 is supplied to the base of the transistor Q6. Additionally, the base of the transistor Q6 receives the signal which appears at an input A (i.e., the AC component of the undelayed signal appearing at the input X processed through the DC blocking capacitor C1).

In the operation of the transistors Q5–Q6, if the voltage appearing at the base of the transistor Q6 is less than the voltage appearing at the base of the transistor Q5, then nearly all of the current supplied through the resistor R2 will flow through the transistor Q5. The transistor Q6, on the other hand, will cut off. Similarly, if the voltage appearing at the base of the transistor Q6 is greater than the voltage appearing at the base of the transistor Q5, nearly all of the current supplied through the resistor R2 will flow through the transistor Q6 and the transistor Q5 will cut off.

The operation of the transistor pairs Q1–Q2 and Q3–Q4 will now be discussed. The base of each transistor Q1–Q4 receives a bias voltage via the source voltage $V_{cc}$ and a voltage divider resistor network. The bases of the transistors Q1 and Q4 are connected to resistors R5 and R6 and the bases of the transistors Q2 and Q3 are connected to resistors R7 and R8.

As depicted, the common emitter connection of each pair of transistors Q1–Q2 or Q3–Q4 is connected to the collector of one of the transistors Q6 or Q5 respectively. The respective transistor Q5 or Q6 supplies current to the emitters of its corresponding transistor pair Q3–Q4 or Q1–Q2. If no current flows through the transistor Q5 or Q6, then the respective transistor pair Q3–Q4 or Q1–Q2 connected thereto will be disabled. The operation of each transistor pair Q1–Q2 and Q3–Q4 is otherwise similar to that of the pair Q5–Q6.

The signal appearing at an input B, i.e., the signal appearing at the input X delayed by the inductor L1 is applied to the bases of both transistors Q1 and Q4. The purpose of the inductor L1 is to delay the signals applied to the bases of the transistors Q1 and Q4 with respect to the signal applied to the base of the transistor Q6. Illustratively, the inductor L1 is selected to delay the signal appearing at the input B by one-fourth of the period of an NRZ signal which encodes an alternating sequence of bits, e.g., '010101 . . . ', at a bit rate of 155.52 Mb/sec. Such an inductor may be fabricated as a conductor or lead which is laid out directly onto a printed circuit board.

The collector of each transistor Q1 and Q3 is connected to an output Y' which measures a voltage across the resistor R9. Similarly, the collector of each transistors Q2 and Q4 is connected to an output Y which measures a voltage across the resistor R10. It may be appreciated that the total current supplied to the common emitter connection of each transistor pair Q1–Q2, Q3–Q4 or Q5–Q6 is divided between the two transistors of that pair. Thus, the output Y' is the complement of the output Y.

If the transistor pair Q1–Q2 is enabled, and a higher voltage is inputted to the base of the transistor Q1 than Q2, the transistor Q2 will cut off. A low level voltage would appear at the output Y. If the voltage inputted to the base of the transistor Q1 is lower than the voltage inputted to the base of the transistor Q2, then the transistor Q2 will switch on and a high level voltage will appear at the output Y.

If the transistor pair Q3–Q4 is enabled, and a higher voltage is inputted to the base of the transistor Q4 than Q3, the transistor Q4 will switch on. Thus, a high level voltage will appear at the output Y. If the voltage inputted to the base of the transistor Q4 is lower than the voltage inputted to the base of the transistor Q3, the transistor Q4 will cut off and a low level voltage will appear at the output Y.

The transistor pair Q3–Q4 thus operates as a logic OR gate. If the base of the transistor Q3 is connected to a voltage level corresponding to logic '0', then the signal appearing at the output Y will always have the same logic values as the signal appearing at the base of the transistor Q4. Similarly, the transistor pair Q1–Q2 operates as a logic NOR gate. If the base of the transistor Q2 is connected to a voltage level corresponding to logic '0' then the signal appearing at the output Y will always be the complement of the signal appearing at the base of the transistor Q1. Finally, the pair Q5–Q6 operates as a multiplexer. The transistor pair Q5–Q6 enables the operation of one or the other transistor pair Q1–Q2 or Q3–Q4.

Illustratively, this circuit 132 produces the exclusive-or (XOR) of two input signals. For example, suppose a first signal is applied to the input A (inputted to the base of the transistor Q6) and a second signal is applied to the input B (inputted to the bases of both transistors Q1 and Q4). If the signal applied to input A is a logic '1', then the signal appearing at the output Y will be equal to the complement of the signal applied to the input B. If the signal applied to the input A is a logic '0', then the signal appearing at the output Y will have the same logic value as the signal applied to the input B. Thus, if the signals applied to the inputs A and B are both logic '1' or both logic '0', the signal produced at the output Y is a logic '0'. However, if one of the inputted signals is a logic '1' while the other is a logic '0', the signal produced at the output Y is a logic '1'.

In order to double the frequency of a received NRZ signal, the received NRZ signal is applied to the input X. Thus, the received NRZ signal is applied directly to the base of the transistor Q6. The received NRZ signal is also delayed for a period equal to one-fourth of the period of an NRZ signal of alternating logic bit values (e.g., '010101 . . .'). This delayed NRZ signal is applied to the bases of both the transistors Q1 and Q4. The inputted signals and the resulting signals appearing at the outputs Y and Y' are illustrated in FIG. 7.

Figure 7:
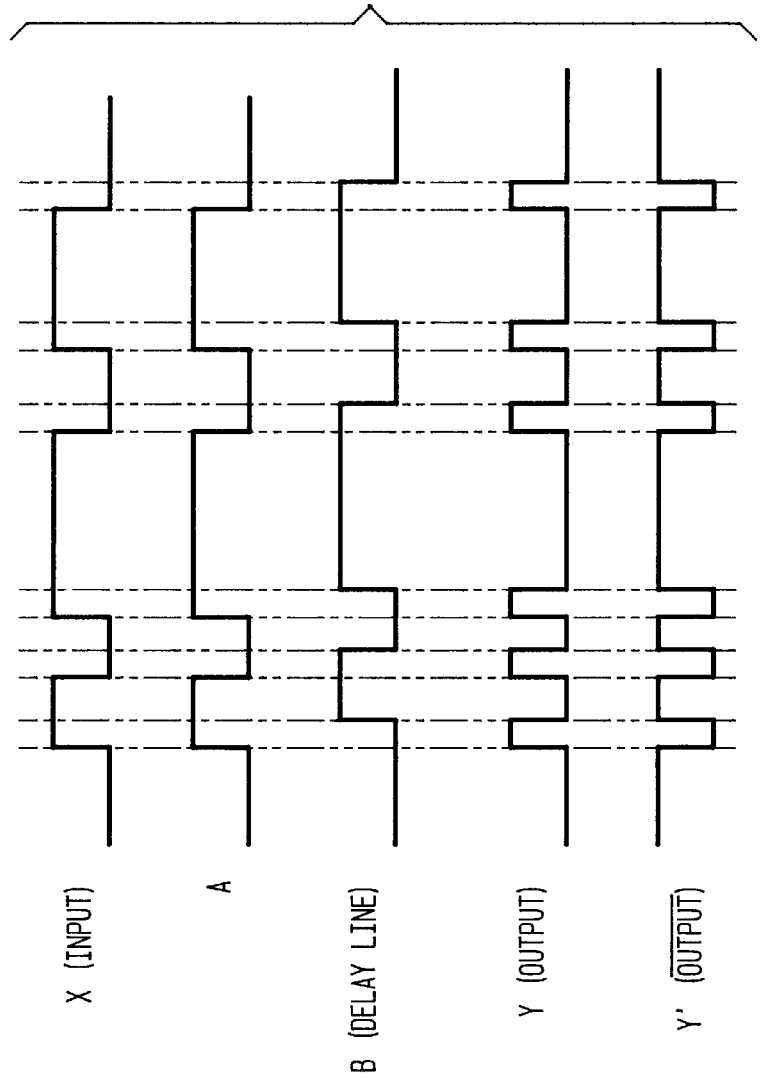
FIG. 7 illustrates ideal input and output wave forms of the mixer of FIG. 5.

As can be seen in FIG. 7, the signal appearing at the output Y of the Gilbert cell 132 is a frequency doubled NRZ signal with a series of impulses. The rising edge of each impulse coincides with a boundary of the NRZ signal, i.e., where the NRZ signal changes from a logic '0' to a logic '1' or vice versa. The signal appearing at the output Y' is the complement of the signal appearing at the output Y.

Figure 8:
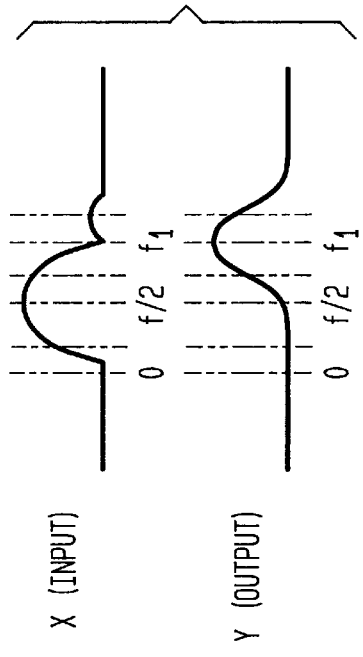
FIG. 8 illustrates distorted input and output waves forms of the mixer of FIG. 5.

FIG. 8 depicts the signal appearing at the output Y when a distorted NRZ signal is applied to the input X. The distorted signal encodes the bit sequence '110'. The signal appearing at the output Y resembles a Guassian centered at the point between the second bit '1' and the third bit '0'.

Returning to FIG. 5, the frequency doubled NRZ signal is inputted to a SAW filter 136. This signal may be the signal appearing at the output Y or the signal appearing at the output Y' of the circuit 132 of FIG. 6. The SAW filter 136 illustratively filters the clock signal (or its complement, depending on which of the aforementioned signals is used) from the frequency doubled NRZ signal. As stated before, the SAW filter may introduce a loss of up to 17 dBm to the signal. The clock is therefore amplified in a clock amplifier 138.

The amplified clock is then inputted to a phase adjuster 140 which adjusts the phase of the clock signal to optimize the decisions made by the decision circuit. Thereafter, the phase adjusted clock is inputted to the decision circuit 130. In addition, the amplified clock is inputted to a level shifter 142. The purpose of the level shifter 142 is to output the clock (and its complement) to other elements in the optical transceiver. The level shifter 142 adjusts the voltage level of the clock signal in accordance with the requirements of the system. For instance, other components in the optical transceiver 100 may use emitter coupled logic circuits. In such a case, the level adjuster would output a clock signal at a level appropriate for driving emitter coupled logic circuits.

In summary, a clock recovery circuit is disclosed for recovering data from a distorted NRZ signal received by an optical transceiver. The clock recovery circuit uses an inventive mixer which comprises active (rather than passive) elements. As such, an amplifier is not needed between the mixer and the SAW filter of the clock recovery circuit.

Finally, the aforementioned embodiments are intended to be merely illustrative of the invention. Numerous other embodiments may be devised by those with ordinary skill in the art without departing from the scope of the following claims.

We claim:

1. A circuit for recovering a clock from a received, distorted non-return to zero (NRZ) signal, comprising:
  (a) an input connected to said received distorted NRZ signal;
  (b) a delay connected to the input and configured to receive the received, distorted NRZ signal and to delay the received, distorted NRZ signal a predetermined period;
  (c) a first reference voltage source connected to receive the delayed NRZ signal and and configured to generate a first reference voltage;

(d) a second reference voltage source connected to the input and configured to receive the received, distorted NRZ signal and configured to generate a second reference voltage;

(e) an exclusive-OR circuit connected to the first and second reference voltage sources and configured to receive the received, distorted NRZ signal, the first reference voltage, the second reference voltage, and the delayed NRZ signal, the exclusive-OR circuit further comprising:

(1) an OR gate comprising a first transistor and a second transistor, the first transistor connected to receive the delayed NRZ signal and the first reference voltage, and the second transistor connected to a third reference voltage source, the OR gate configured to generate at a collector of the first transistor a first signal corresponding to the logical OR of the delayed NRZ signal and said third reference voltage source, said first signal resembling a Gaussian and having an amplitude large enough to be processed by a SAW filter;

(2) a NOR gate comprising a third transistor and a fourth transistor, the third transistor connected to receive the delayed NRZ signal and the first reference voltage, and the fourth transistor connected to the third reference voltage source, the NOR gate configured to generate at a collector of the fourth transistor a second signal corresponding to the logical NOR of the delay NRZ signal and said third reference voltage source, the second signal resembling a Gaussian and having an amplitude large enough to be processed by the SAW filter;

(3) a multiplexer comprising a fifth transistor and a sixth transistor, the sixth transistor connected to receive the received, distorted NRZ signal and the second reference voltage and the fifth transistor connected to receive a fourth reference voltage, the multiplexer configured to activate the NOR gate when at least one of the received, distorted NRZ signal and second reference voltage exceeds the fourth reference voltage and to activate the OR gate when the fourth reference voltage exceeds both of the received, distorted NRZ signal and the second reference voltage;

(4) the collectors of the first, second, third, and fourth transistors being directly connected to the SAW filter;

(f) the SAW filter directly connected to the collectors of the first, second, third, and fourth transistors and configured to receive one of the first and second signals, and configured to recover a clock from one of the first and second signals; and (g) an output of the SAW filter directly connected to a clock amplifier.

* * * * *